(12) United States Patent
Isagoda

(10) Patent No.: US 10,847,915 B2
(45) Date of Patent: Nov. 24, 2020

(54) ELECTRICAL CONTACT AND ELECTRIC COMPONENT SOCKET

(71) Applicant: ENPLAS CORPORATION, Kawaguchi (JP)

(72) Inventor: Satoru Isagoda, Kawaguchi (JP)

(73) Assignee: ENPLAS CORPORATION, Saitama (JP)

(*) Notice: Subject to any disclaimer, the term of this patent is extended or adjusted under 35 U.S.C. 154(b) by 0 days.

(21) Appl. No.: 16/473,500

(22) PCT Filed: Dec. 22, 2017

(86) PCT No.: PCT/JP2017/046157
§ 371 (c)(1),
(2) Date: Jun. 25, 2019

(87) PCT Pub. No.: WO2018/123876
PCT Pub. Date: Jul. 5, 2018

(65) Prior Publication Data
US 2020/0006882 A1    Jan. 2, 2020

(30) Foreign Application Priority Data

Dec. 27, 2016 (JP) ................................. 2016-253017

(51) Int. Cl.
*H01R 13/24* (2006.01)
*G01R 1/04* (2006.01)
(Continued)

(52) U.S. Cl.
CPC ....... *H01R 13/2492* (2013.01); *G01R 1/0466* (2013.01); *G01R 31/26* (2013.01); *H01R 12/716* (2013.01); *H01R 2201/20* (2013.01)

(58) Field of Classification Search
CPC . H01R 11/18; H01R 13/2421; H01R 13/2428
(Continued)

(56) References Cited

U.S. PATENT DOCUMENTS 7,612,572 B2    11/2009    Ishizuka
8,087,956 B2 *   1/2012    Nakayama ............. G01R 1/045
                                                        439/700
(Continued)

FOREIGN PATENT DOCUMENTS

EP        0 181 429 A1    5/1986
JP        2002-357622    12/2002
(Continued)

OTHER PUBLICATIONS

PCT/ISA/237, Written Opinion of the International Searching Authority dated Feb. 6, 2018 in corresponding International Patent Application No. PCT/JP2017/046157.
(Continued)

*Primary Examiner* — Phuong K Dinh
(74) *Attorney, Agent, or Firm* — Staas & Halsey LLP

(57) ABSTRACT

An electrical contact and an electric component socket, in which a plurality of protruding portions come in contact with a terminal of an electric component, ensuring to prevent the defect of a large flaw formed on the terminal as well as improve durability of the electrical contact. An electrical contact 15 includes a contacting portion 31 which comes in contact with a terminal 2a of an electric component 2. The contacting portion 31 includes a plurality of convex portions 38 around a center 31b of a tip portion 31a of the contacting portion 31. The convex portion 38 has a plurality of protruding portions 35 on a tip of a mountain-shaped portion of the convex portion 38. The electrical contact 15 is configured to bring the plurality of protruding portions 35 into contact with the terminal 2a to achieve the electrical connection to the electric component 2.

15 Claims, 13 Drawing Sheets

(51) Int. Cl.
*G01R 31/26* (2020.01)
*H01R 12/71* (2011.01)
(58) Field of Classification Search
USPC .................................. 439/700, 824, 482
See application file for complete search history.

(56) References Cited

U.S. PATENT DOCUMENTS

2009/0261851 A1  10/2009  Zhou et al.
2015/0123687 A1   5/2015  Lee
2016/0064291 A1   3/2016  Ishii et al.

FOREIGN PATENT DOCUMENTS

| JP | 2008-241353 | 10/2008 |
| JP | 2012-207994 | 10/2012 |
| JP | 2014-81231 A | 5/2014 |
| JP | 2014-85207 | 5/2014 |
| JP | 2015-520851 | 7/2015 |
| WO | 2011/071082 A1 | 6/2011 |
| WO | WO 2015/138388 A2 | 9/2015 |

OTHER PUBLICATIONS

International Search Report dated Feb. 6, 2018 in corresponding International Patent Application No. PCT/JP2017/046157.
Extended European Search Report dated Jul. 16, 2020, in corresponding European Patent Application No. 17885789.2.

* cited by examiner

FIG.2
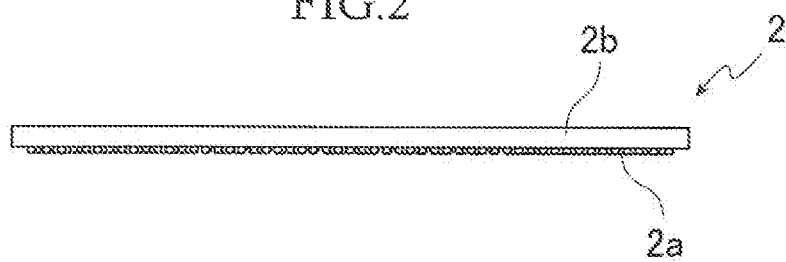
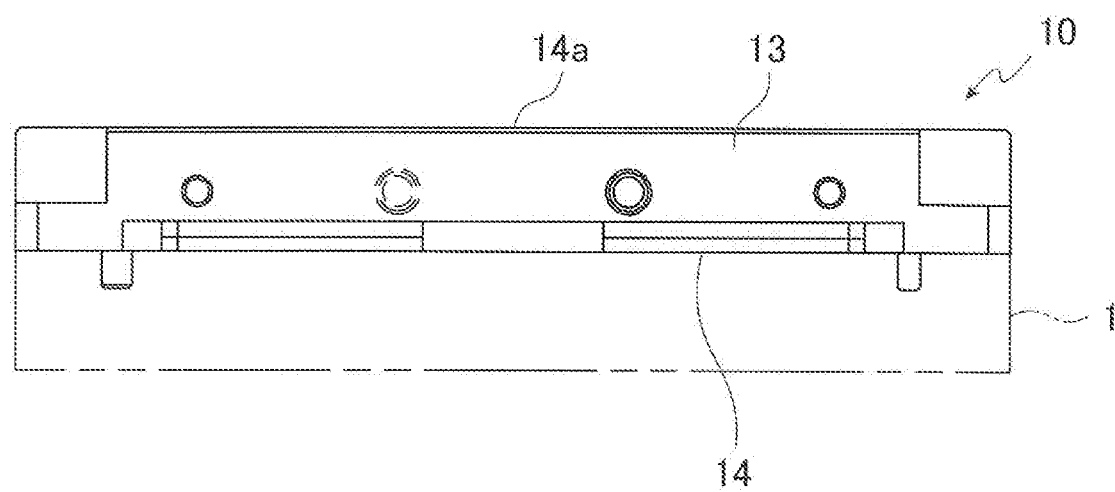

ELECTRICAL CONTACT AND ELECTRIC COMPONENT SOCKET

CROSS-REFERENCE TO RELATED APPLICATION

This application is a U.S. National Stage Application which claims the benefit under 35 U.S.C. § 371 of PCT International Patent Application No. PCT/JP2017/046157, filed, Dec. 22, 2017, which claims the foreign priority benefit under 35 U.S.C. § 119 of Japanese Patent Application No. 2016-253017, filed Dec. 27, 2016, the contents of which are incorporated herein by reference.

TECHNICAL FIELD

The present invention relates to an electrical contact electrically connected to an electric component such as a semiconductor device (hereinafter referred to as an "IC package"), and an electric component socket in which the electrical contacts are disposed.

BACKGROUND ART

Heretofore, as this type of electrical contact, a contact pin provided in an IC socket as an electric component socket has been known. This IC socket is disposed on a wiring substrate and configured to store an IC package as an inspection target. Terminals of this IC package are electrically connected to electrodes of the wiring substrate via the contact pins, so that a test such as a continuity test is performed.

Certain contact pins of the above type may come in contact with an IC package having spherical terminals or other similar terminals. Furthermore, among such the contact pins, a contact pin is known such that a contacting portion of the contact pin to come in contact with the spherical terminal of the IC package is formed in a substantially crown shape having a plurality of protruding portions (e.g., see Patent Literature 1).

CITATION LIST

Patent Literature

Patent Literature 1: Japanese Patent Laid-Open No. 2008-241353

SUMMARY OF INVENTION

Technical Problem

The above-described contact pin as disclosed in Patent Literature 1 is configured to have its contacting portions brought into contact with the spherical terminal of the IC package by thrusting the spherical terminal with tip portions of the protruding portions on the substantially crown-shaped contacting portions. The above-described contact pin may cause a large flaw on the thrustingly contacted spherical terminal, resulting in a risk of defects occurring upon actual use of the IC package. The deep thrusting makes the contacting portion easily breakable, causing the risk of problem in durability of the contact pin.

To solve the problem, an object of the present invention is to provide an electrical contact (a contact pin) configured to be electrically connected to an electric component (an IC package) by bringing a plurality of protruding portions into contact with the terminal, and an electric component socket (an IC socket). Specifically, provided are the electrical contact and the electric component socket which are capable of preventing a defect of a large flaw formed on the terminal of the electric component as well as improving durability of the electrical contact.

Solution to Problem

To achieve such an object, in an aspect of the invention according to claim 1, an electrical contact includes a contacting portion that comes in contact with a terminal of an electric component. The contacting portion includes a plurality of convex portions provided around a center of a tip portion of the contacting portion. The convex portion includes a plurality of protruding portions formed on a tip of a mountain-shaped portion of the convex portion. The protruding portions come in contact with the terminal to be electrically connected to the electric component.

In the aspect of the invention according to claim 2, in addition to the configuration according to claim 1, a first valley-shaped portion is provided between the convex portions. The two protruding portions are formed on a tip of the mountain-shaped portion of the convex portion. A second valley-shaped portion at a depth position shallower than the first valley-shaped portion is provided between the protruding portions.

In the aspect of the invention according to claim 3, in addition to the configuration according to claim 2, each of the two protruding portions formed on the tip of the mountain-shaped portion of one of the convex portions is formed to have a different height of each mountain-shaped portion of the protruding portions.

In another aspect of the invention according to claim 4, there is provided an electric component socket which includes a socket main body disposed on a wiring substrate and having a storage portion in which an electric component is stored, and the electrical contact according to any one of claim 1 to claim 3, which is disposed in the socket main body to come in contact with a terminal provided on the electric component.

Advantageous Effects of Invention

According to the aspect of the invention of claim 1, the contacting portion of the electrical contact includes a plurality of convex portions each having a plurality of protruding portions. The terminal is thrusted with small protruding portions to allow electrical connection. As a result, it is possible to prevent the defect of the large flaw formed on the terminal of the electric component as well as improve durability of the electrical contact.

According to the aspect of the invention of claim 2, the two protruding portions are formed on the tip portion of the mountain-shaped portion of the convex portion while having the shallow second valley-shaped portion interposed therebetween. This makes it possible to easily form the single convex portion provided with two protruding portions.

According to the aspect of the invention of claim 3, each height of the two protruding portions formed on the tip portion of the single convex portion is different from each other. At the beginning, the higher protruding portion comes in contact with the terminal. At a timing when the higher protruding portion is getting worn away, the lower protruding portion comes in contact with the terminal so as to achieve persistent electrical connection. This makes it possible to secure long-term contact stability.

According to an aspect of the invention of claim 4, the electrical contact according to any one of claim 1 to claim 3 is provided. The contacting portion of the electrical contact includes a plurality of convex portions each having a plurality of protruding portions. The terminal is thrusted with the small protruding portions to allow the electrical connection. As a result, it is possible to provide the electric component socket which ensures to prevent the defect of the large flaw formed on the terminal of the electric component as well as improve durability of the electrical contact.

BRIEF DESCRIPTION OF DRAWINGS

FIG. 2 is a front view showing that an IC package is stored in the IC socket according to Embodiment 1.

DESCRIPTION OF EMBODIMENTS

Embodiments according to the present invention will be described.

Embodiment 1 of Invention

FIG. 1 to FIG. 12 show Embodiment 1 of the present invention.

Figure 1:
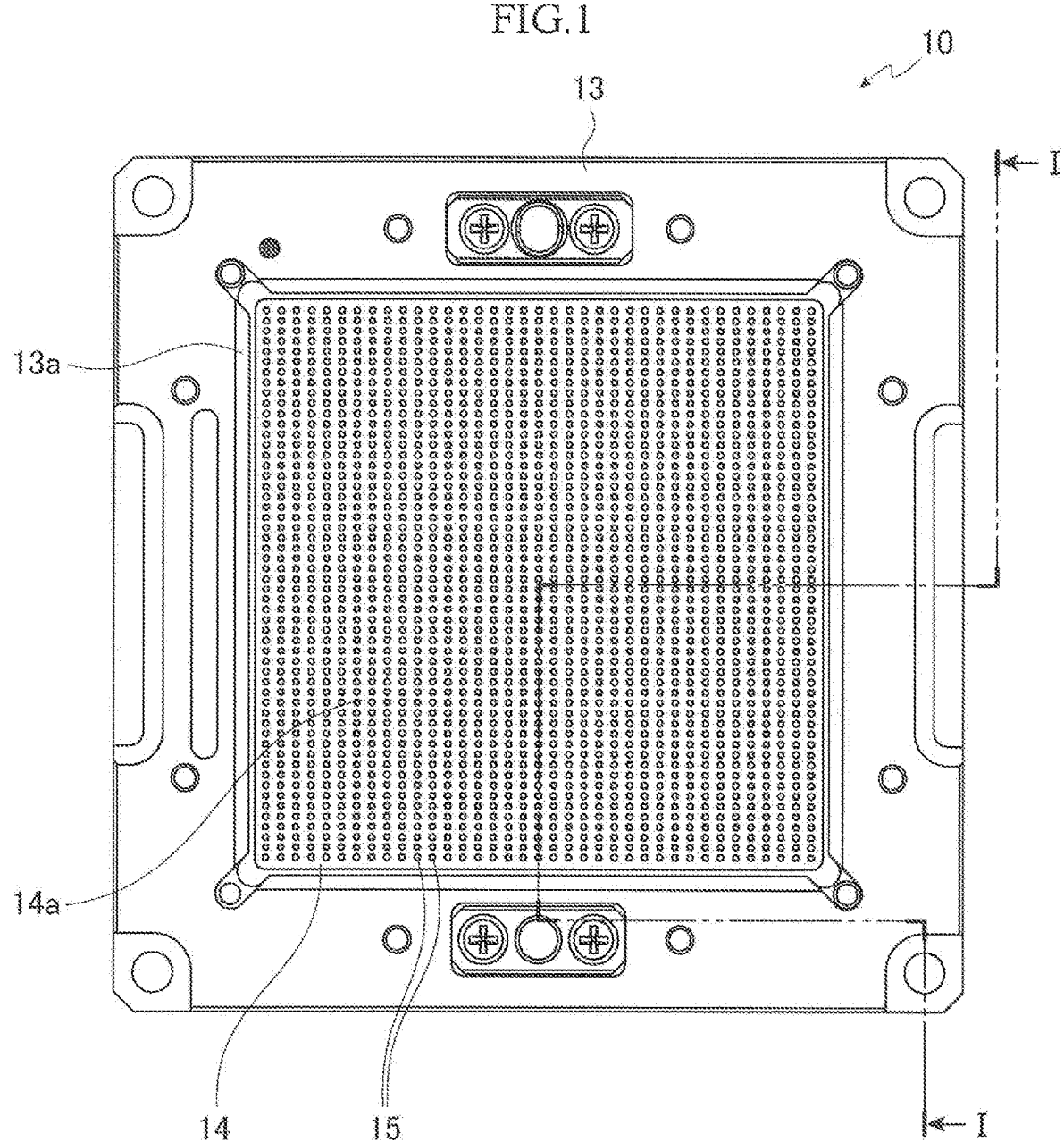
FIG. 1 is a plan view showing an IC socket according to Embodiment 1 of the present invention.
Figure 3:
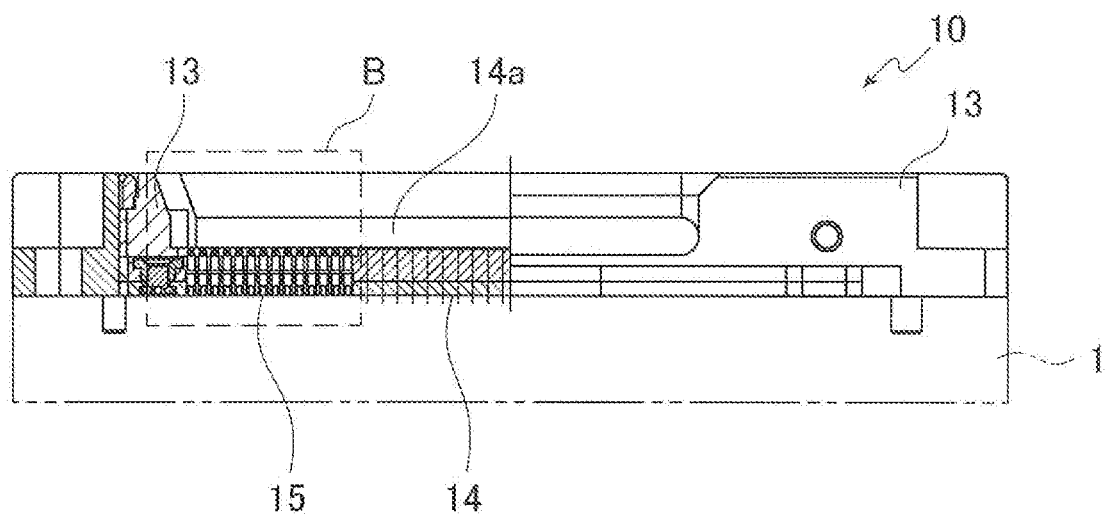
FIG. 3 is a cross-sectional view taken along line I-I of FIG. 1.

An IC socket 10 as "an electric component socket" of the present embodiment is, as shown in FIG. 1 and FIG. 2, fixed on a wiring substrate 1, stores an IC package 2 as "an electric component" in an upper part of the socket, and is configured to electrically connect electrodes (not shown) of the wiring substrate 1 to solder balls 2a as "terminals" of the IC package 2. For example, the IC socket 10 is for use in a test device or the like for a continuity test such as a burn-in test and a reliability test to the IC package 2.

Figure 11:
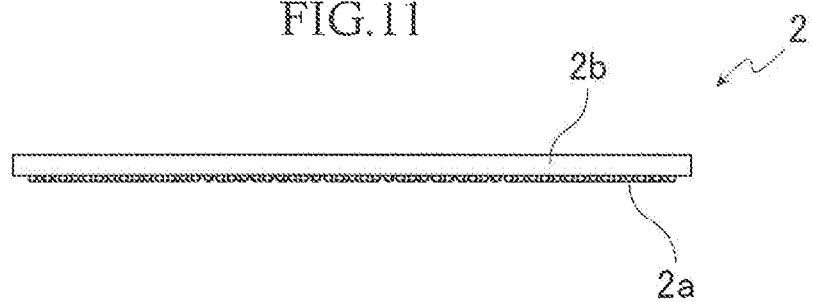
FIG. 11 is a front view of the IC package for use in Embodiment 1.
Figure 12:
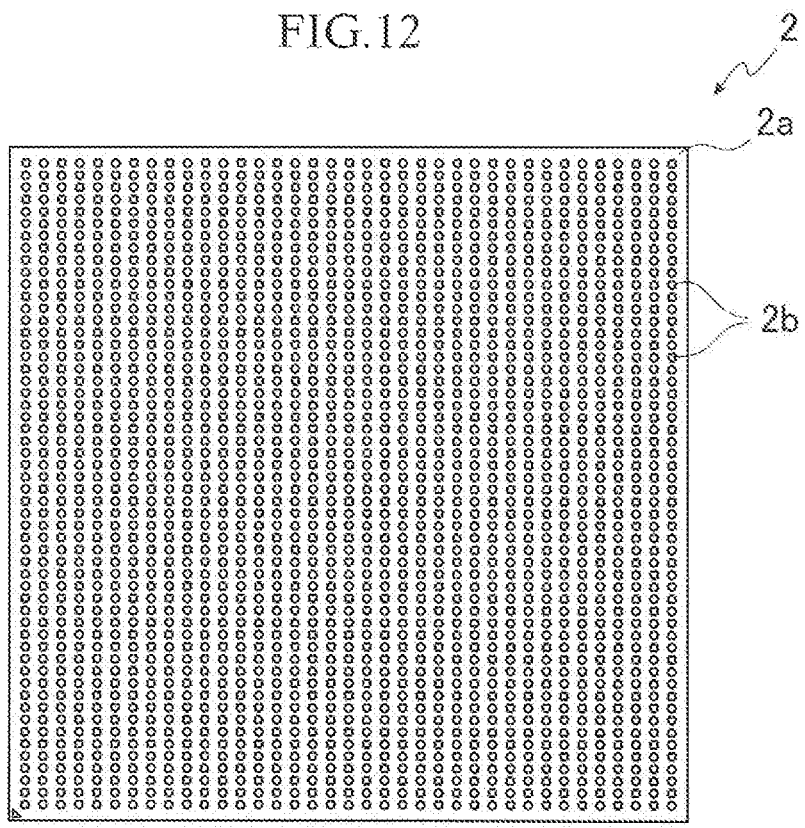
FIG. 12 is a bottom view of the IC package for use in Embodiment 1.

First, the IC package 2 of the present embodiment will be described with reference to FIG. 11 and FIG. 12. As shown in FIG. 11 and FIG. 12, the IC package 2 of the present embodiment has a package main body 2b having a substantially square shape in planar view, and a plurality of spherical solder balls 2a are provided in a matrix manner on a lower surface of the package main body 2b.

Next, the IC socket 10 of the present embodiment will be described with reference to FIG. 1 to FIG. 10. The IC socket 10 of the present embodiment includes a frame-shaped guide member 13 attached onto a socket main body 14. Furthermore, the socket main body 14 has an upper plate 11 and a lower plate 12.

Additionally, the socket main body 14 includes contact pins 15 as a plurality of "electrical contacts" disposed to extend through the socket main body 14 in a vertical direction, and the plurality of contact pins 15 are arranged in a matrix manner in the socket main body 14. In addition, the upper plate 11 and the lower plate 12 of the socket main body 14 are fixed with fixing screws (not shown), and are positioned with positioning pins (not shown) on the wiring substrate 1. Furthermore, a guide portion 13a is disposed on an inner side of the frame-shaped guide member 13 while being formed to tilt inwardly and downwardly so that the IC package 2 is guided.

In addition, a portion above the upper plate 11 in the socket main body 14 constitutes a storage portion 14a to store the IC package 2 guided from upside by the guide portion 13a of the guide member 13.

In the present embodiment, an arrangement pitch of the solder balls 2a of the IC package 2 is the same as an arrangement pitch of the electrodes of the wiring substrate 1 which are electrically connected to the solder balls 2a, and an arrangement pitch of the contact pins 15 is the same as the above-described arrangement pitch.

Figure 6:
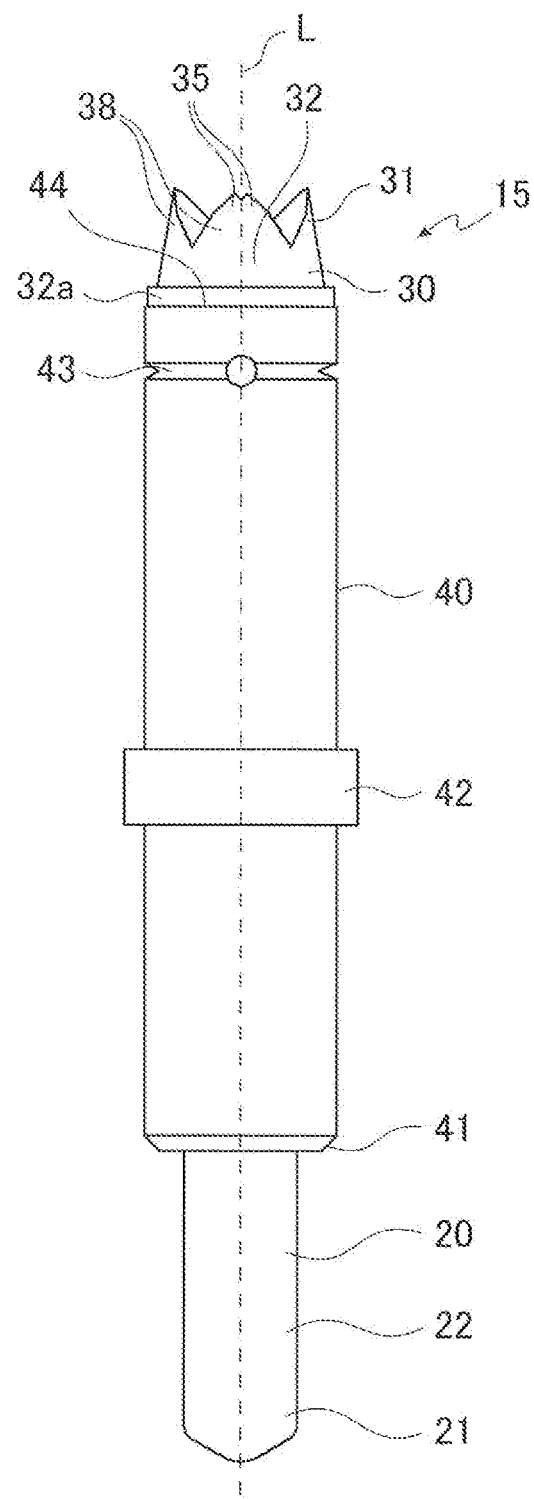
FIG. 6 is an enlarged view of a contact pin in the IC socket according to Embodiment 1.
Figure 7:
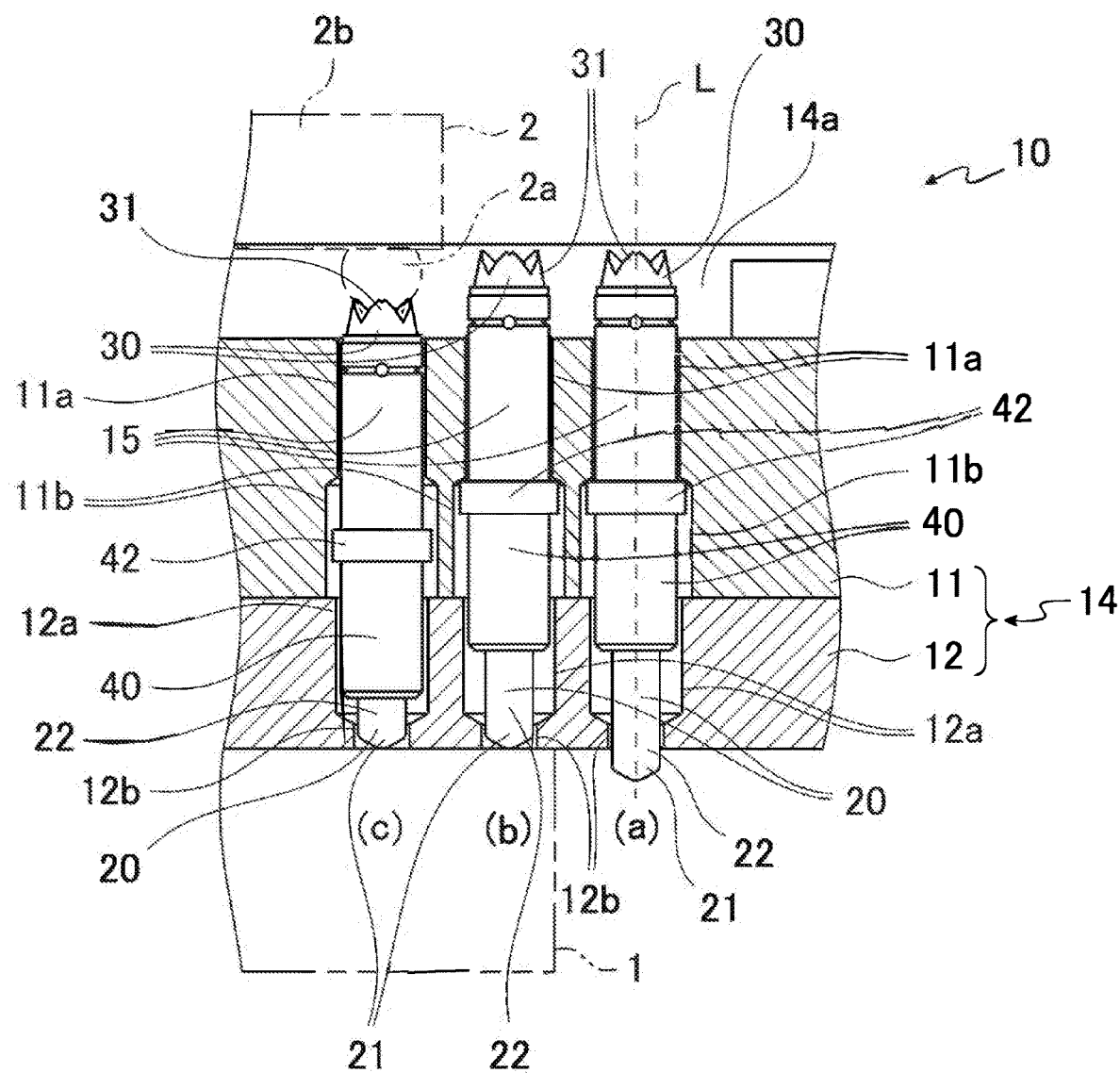
FIG. 7 is an enlarged cross-sectional view showing that the contact pins are arranged in the IC socket according to Embodiment 1.
Figure 8:
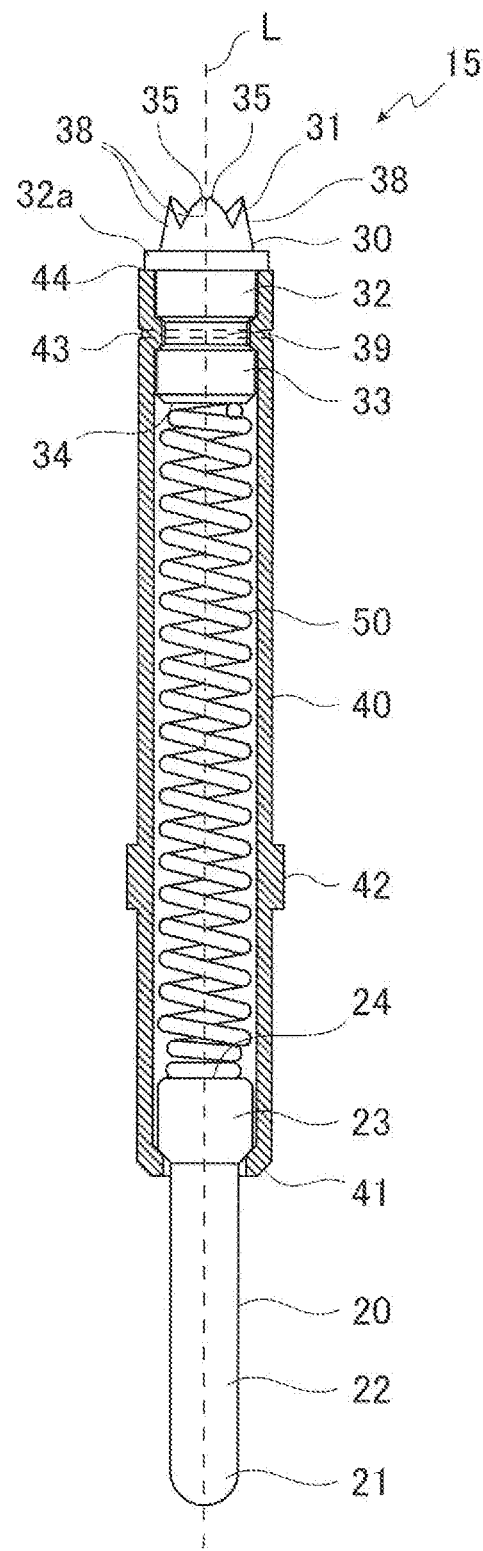
FIG. 8 is an enlarged cross-sectional view showing the contact pin according to Embodiment 1.

As shown in FIG. 6 to FIG. 8, each contact pin 15 includes, along a longitudinal axial line L, a first plunger 20 having, at a tip of the plunger, a first contacting portion 21 that electrically comes in contact with the electrode of the wiring substrate 1; a second plunger 30 having, at a tip of the plunger, a second contacting portion 31 as "a contacting portion" that electrically comes in contact with the solder ball 2a of the IC package 2; and a tubular member 40 that is continuous between the first plunger 20 and the second plunger 30. In the tubular member 40, a coil spring 50 is stored which urges the first plunger 20 and the second plunger 30 to be away from each other along the axial line L.

The tubular member 40 is made of a material having conductivity, and is, as shown in FIG. 6 to FIG. 8, inserted into a lower-side upper through hole 12a provided in the lower plate 12, and an upper-side upper through hole 11a and an upper-side lower through hole 11b provided in the upper plate 11, so that the tubular member can slide in the through holes 11a, 11b and 12a. Furthermore, an enlarged diameter portion 42 is formed on a part of an outer side of the tubular member 40. The enlarged diameter portion 42 is inserted into the upper-side lower through hole 11b so that the enlarged diameter portion 42 can slide in a direction (an upward-downward direction) along the axial line L in the upper-side lower through hole lib. Furthermore, each width of the upper-side upper through hole 11a and the lower-side upper through hole 12a is set so as not to allow insertion of the enlarged diameter portion 42, and so as to allow insertion of the other part of the tubular member 40. Consequently, an upper end and a lower end of the upper-side lower through hole 11b serve as stoppers, and the enlarged diameter portion 42 is allowed to slide only in the upper-side lower through hole 11b.

The first plunger 20 is made of, for example, palladium alloy, and includes a first protruding portion 22 including, at a tip of the portion, the first contacting portion 21 having a tapered shape and a protruding region along the longitudinal axial line L of the contact pin 15 to come in contact with the electrode of the wiring substrate 1; and a first inserting portion 23 that is wider than the first protruding portion 22. The first inserting portion 23 of the plunger is stored in the tubular member 40 to be slidably in contact with an interior of the tubular member 40, and movement of the first plunger 20 in a protruding direction (a downward direction) is regulated by a first locking portion 41 formed at a lower end of the tubular member 40.

Furthermore, a first receiving portion 24 that locks the coil spring 50 is formed in a substantially flat shape integrally with an end of the first inserting portion 23. Additionally, the first protruding portion 22 is slidably inserted into a lower-side lower through hole 12b of the lower plate 12. In addition, as shown in FIG. 7(b), the first contacting portion 21 formed in a convex curved-surface shape at the tip of the first protruding portion 22 comes in contact with the electrode of the wiring substrate 1, thereby electrically connecting to the wiring substrate 1.

The second plunger 30 is made of, for example, palladium alloy, and includes, as shown in FIG. 8, a second protruding portion 32 having, at a tip of the portion, the second contacting portion 31 (a shape of the portion will be described later) having a predetermined shape that comes in contact with the solder ball 2a of the IC package 2; a small diameter portion 39 having a diameter smaller than a diameter of the second protruding portion 32, and a second inserting portion 33 formed to have the same diameter as the diameter of the second protruding portion 32. These portions are continuously and integrally formed. Furthermore, the second plunger 30 includes a flange portion 32a at a middle position of the second protruding portion 32 in a direction along the axial line L. The flange portion 32a of the second plunger 30 abuts on an upper end 44 of the tubular member 40 from upside, and the small diameter portion 39 is fitted in a fitting portion 43 caulked and formed in a small diameter in the vicinity of the upper end 44 of the tubular member 40, so that the second plunger 30 is held in a state where movement of the second plunger 30 in the direction along the axial line L (the upward-downward direction) is regulated by the tubular member 40.

Figure 9:
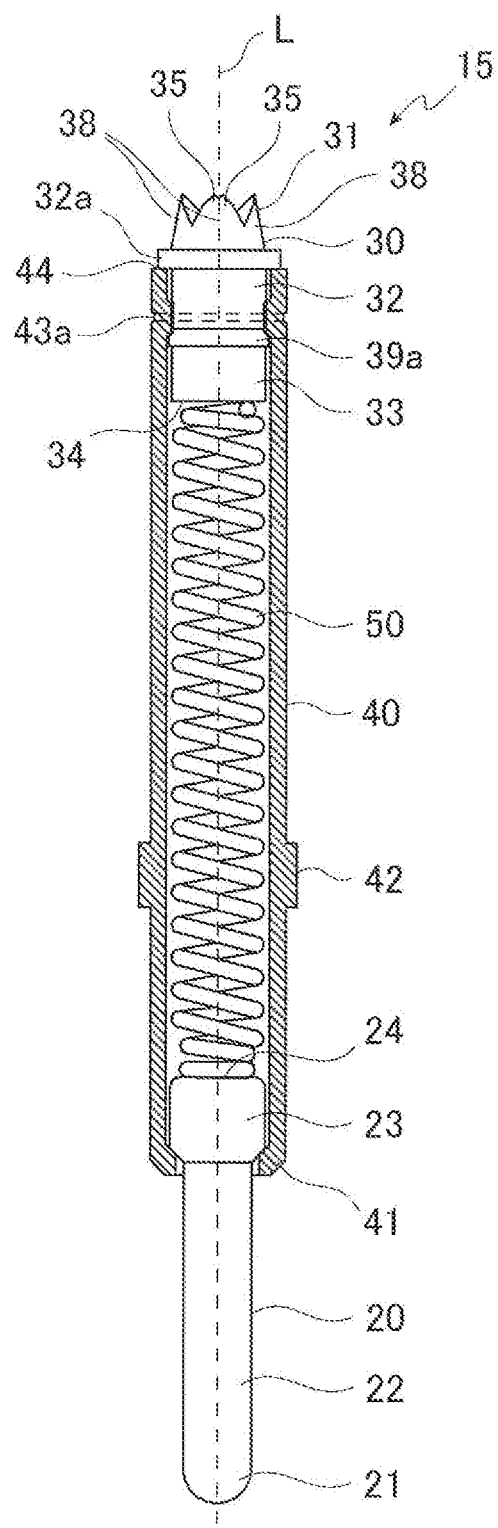
FIG. 9 is an enlarged cross-sectional view showing a modification of the contact pin according to Embodiment 1.

Note that as a configuration to hold the second plunger 30 in the state where the movement of the second plunger 30 in the axial line L direction (the upward-downward direction) is regulated by the tubular member 40, as shown in FIG. 9, there may be used a configuration that does not have the small diameter portion 39 in the second plunger 30, and instead has a large diameter portion 39a between the second protruding portion 32 and the second inserting portion 33 each having the same diameter. In this configuration, the flange portion 32a abuts on the upper end 44 of the tubular member 40 from the upside, a reduced diameter portion 43a is formed by reducing a diameter of the tubular member 40 to a smaller diameter right above the large diameter portion 39a, and the large diameter portion 39a abuts on the reduced diameter portion 43a from downside. In this way, the second plunger 30 is held in the tubular member 40.

Furthermore, a second receiving portion 34 that locks the coil spring 50 is formed in a substantially flat shape on an end of the second inserting portion 33. Additionally, a part of the second protruding portion 32, which is upper than the flange portion 32a, protrudes up from the upper plate 11, and the second contacting portion 31 can abut on the solder ball 2a of the IC package 2 stored in the storage portion 14a.

Figure 10:
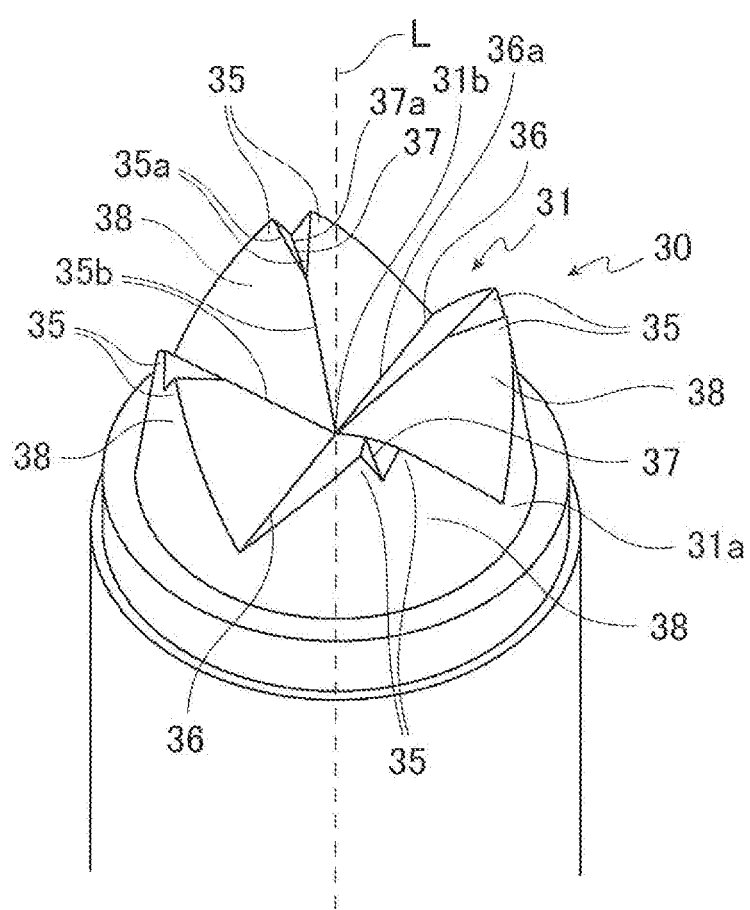
FIG. 10 is an enlarged perspective view of a contacting portion of the contact pin according to Embodiment 1.

Additionally, as shown in FIG. 7(c), the second contacting portion 31 of the second plunger 30 comes in contact with a certain range of the solder ball 2a to electrically connect the IC package 2 to the IC socket 10. As shown in FIG. 10, the second contacting portion 31 is formed to have a plurality of (eight herein) protruding portions 35.

In this embodiment, as shown in FIG. 10, the plurality of (four herein) mountain-shaped convex portions 38 are arranged at substantially equal intervals along the circumference of a substantially round periphery of a center 31b in planar view on a tip surface, opposed to the solder ball 2a, of the tip portion 31a of the second contacting portion 31, which comes in contact with the solder ball 2a. This convex portion 38 is formed to have its protruding height increased from an inner circumferential side toward an outer circumferential side. A tip of the mountain-shaped portion at the outer circumferential side is divided into a plurality of (two herein) portions to constitute a plurality of (two herein) pointed protruding portions 35 each having substantially the same shape.

Those protruding portions 35 are configured to thrustingly come in contact with the solder ball 2a so that the IC package 2 is electrically connected to the IC socket 10.

A first valley-shaped portion 36 and a second valley-shaped portion 37 are alternately formed among pairs of the protruding portions 35. In this embodiment, the first valley-shaped portion 36 is formed between the convex portions 38 of four which are arranged at substantially equal intervals, and each of the second valley-shaped portions 37 is formed between the two protruding portions 35 formed on the tip portions of four convex portions 38.

Each of a first valley bottom portion 36a of the first valley-shaped portion 36, and a second valley bottom portion 37a of the second valley-shaped portion 37 is formed to have substantially the same V-shaped cross-section. Two linear first valley bottom portions 36a are formed to cross with each other at the center 31b of the second contacting portion 31. The second valley-shaped portion 37 is linearly formed in a plane of the second contacting portion 31, which is orthogonal to the axial line L (substantially horizontal plane) in the depth from the tip of the second contacting portion 31 shallower than the depth of the first valley-shaped portion 36, while extending from the position outwardly distant from the center 31b by a predetermined length toward the outer circumferential side.

In other words, in this embodiment, the first valley bottom portion 36a is formed deeply from the tip of the second contacting portion 31, and the second valley bottom portion 37a is formed shallowly from the tip portion of the second contacting portion 31. In the resultant configuration, the valley bottom portions 36a and 37a constitute a stepped portion.

A first peak-shaped portion 35a is formed while smoothly and tiltingly descending from each of the two protruding portions 35 on the way toward the center 31b of the second contacting portion 31. A second peak-shaped portion 35b is formed while smoothly and tiltingly descending from an end of the first peak-shaped portion 35a at a side of the center 31b toward the center 31b of the second contacting portion 31.

The protruding portion 35 includes the single first peak-shaped portion 35a, that is, eight first peak-shaped portions 35a in total are formed. The two first peak-shaped portions 35a join with each other on the way toward the center 31b of the second contacting portion 31. The second peak-shaped portion 35b is formed from the position where the two first peak-shaped portions 35a are joined to the center 31b of the second contacting portion 31. Each one of the four second peak-shaped portions 35b is formed corresponding to the two protruding portions 35 at a tilting angle set to be larger than the tilting angle of the first peak-shaped portion 35a.

Next, description will be made as to a manufacturing method of the contact pin 15 including the second plunger 30 having the second contacting portion 31 as described above with reference to FIG. 8 to FIG. 10.

First, the tubular member 40 is formed into a tubular shape and provided with the enlarged diameter portion 42 formed on a part of an outer side, and the coil spring 50 having a predetermined shape is formed.

At this time, the tubular member 40 is formed in a tubular shape to have the uniform diameter in the axial line L direction, and not provided with the first locking portion 41 and the fitting portion 43.

Furthermore, there is formed the first plunger 20 including the first protruding portion 22 having the first contacting portion 21, and the first inserting portion 23 having the first receiving portion 24, which is wider than the first protruding portion 22.

Additionally, a tip portion of a metal rod member (not shown) having a predetermined shape is processed so that the second plunger 30 is provided with the second contacting portion 31. In consequence, as shown in FIG. 10, the second contacting portion 31 having the eight protruding portions 35 is formed. During the processing, the flange portion 32a is formed on the metal rod member.

Subsequently, the small diameter portion 39 is formed by cutting, pressing and the like, and the metal rod member is processed, for example, by cutting in a predetermined length, to form the second plunger 30.

Afterward, the first inserting portion 23 of the first plunger 20 is inserted into the tubular member 40 from the downside, and the lower end of the tubular member 40 is, for example, caulked, to form the first locking portion 41 having a smaller diameter than the first inserting portion 23 and having a larger diameter than the first protruding portion 22, and the first plunger 20 is slidably held in the tubular member 40 in the axial line L direction.

Next, the second inserting portion 33 of the second plunger 30 is inserted into the tubular member 40 from the upside, so that the flange portion 32a abuts on the upper end 44 of the tubular member 40 from the upside. Then, a portion of the tubular member 40 at a position corresponding to the small diameter portion 39 of the second plunger 30 is caulked or otherwise narrowed down, to form the fitting portion 43 in the tubular member 40. Consequently, the flange portion 32a and the small diameter portion 39 are held by the upper end 44 and the fitting portion 43, respectively so as not to move in the axial line L direction, and the contact pin 15 is formed.

The manufacturing method of the contact pin configured to hold the second plunger 30 in the tubular member 40 while regulating movement of the second plunger 30 in the axial line L direction (the upward-downward direction) is partially modified as described below to configure a contact pin in which the second plunger 30 does not have the small diameter portion 39, but the large diameter portion 39a between the second protruding portion 32 and the second inserting portion 33 each having the same diameter as show in FIG. 9.

That is, in the process of forming the second plunger 30, the metal rod member is provided with the flange portion 32a and the large diameter portion 39a.

Furthermore, the second inserting portion 33 of the second plunger 30 is inserted into the tubular member 40 from the upside so that the flange portion 32a abuts on the upper end 44 of the tubular member 40 from the upside. Then, a portion of the tubular member 40 at a position corresponding to a position right above the large diameter portion 39a of the second plunger 30 is caulked or otherwise narrowed down, to form the reduced diameter portion 43a in the tubular member 40. Consequently, the flange portion 32a and the large diameter portion 39a are held by the upper end 44 and the reduced diameter portion 43a, respectively while being kept immovable in the axial line L direction, and the contact pin 15 is formed.

Next, description will be made as to an operation of the IC socket 10 including the contact pin 15 having the second plunger 30 provided with the above-described second contacting portion 31.

When using this IC socket 10, the plurality of contact pins 15 are fitted in the socket main body 14, and as shown in FIG. 7(a), the contact pin is arranged by protruding the first contacting portion 21 of the first plunger 20 downwards, and the second contacting portion 31 of the second plunger 30 upwards. Then, the IC socket 10 is positioned and fixed to the wiring substrate 1, and as shown in FIG. 7(b), the first contacting portion 21 of the first plunger 20 is brought into contact with the electrode of the wiring substrate 1. At this time, in the tubular member 40, the coil spring 50 is compressed by the first receiving portion 24 on the first inserting portion 23 of the first plunger 20, and as a result, the enlarged diameter portion 42 of the tubular member 40 is pushed onto the upper end of the upper-side lower through hole lib.

Figure 4:
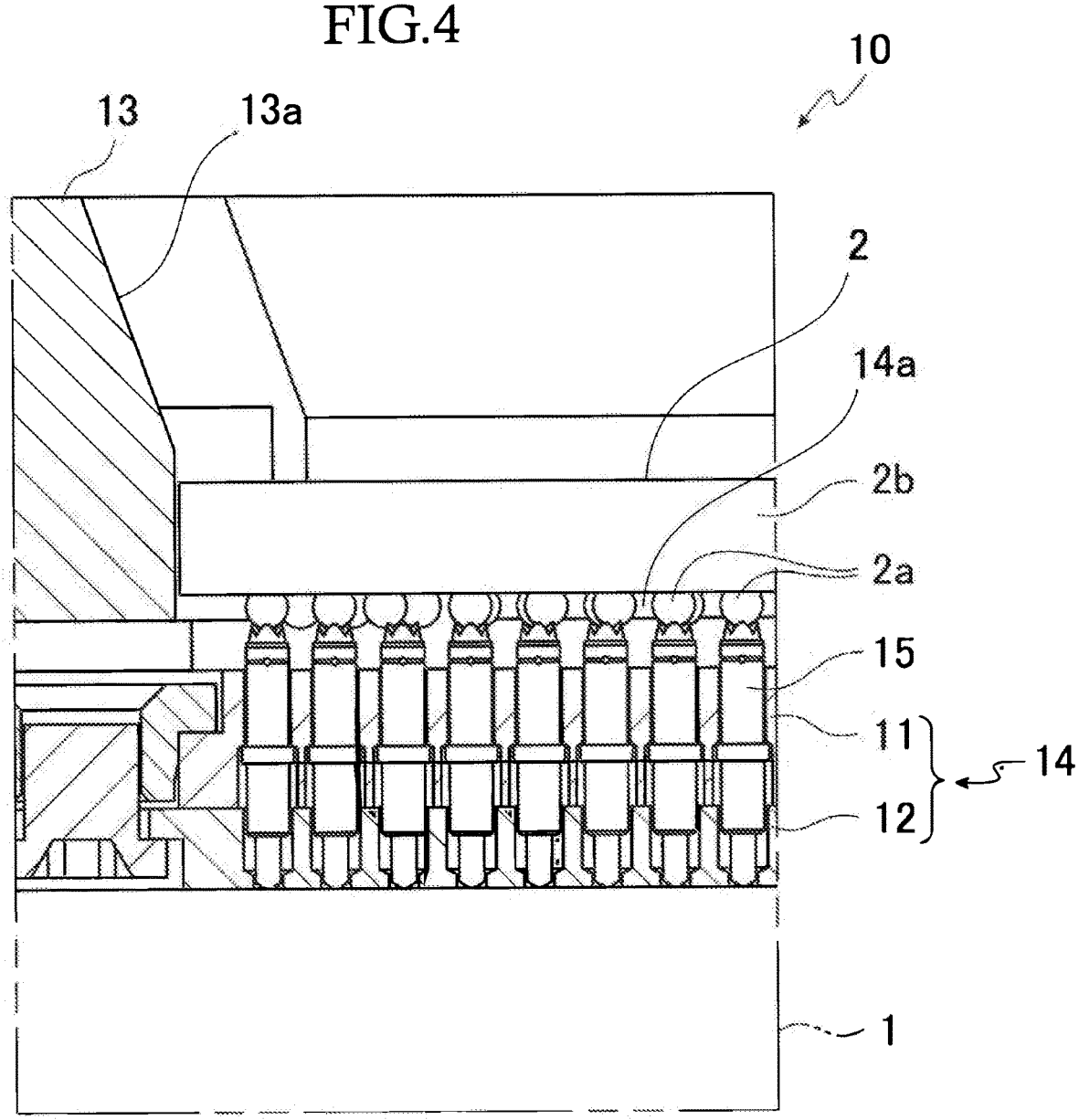
FIG. 4 is an enlarged cross-sectional view showing that the IC package is stored in a B part shown in FIG. 3.
Figure 5:
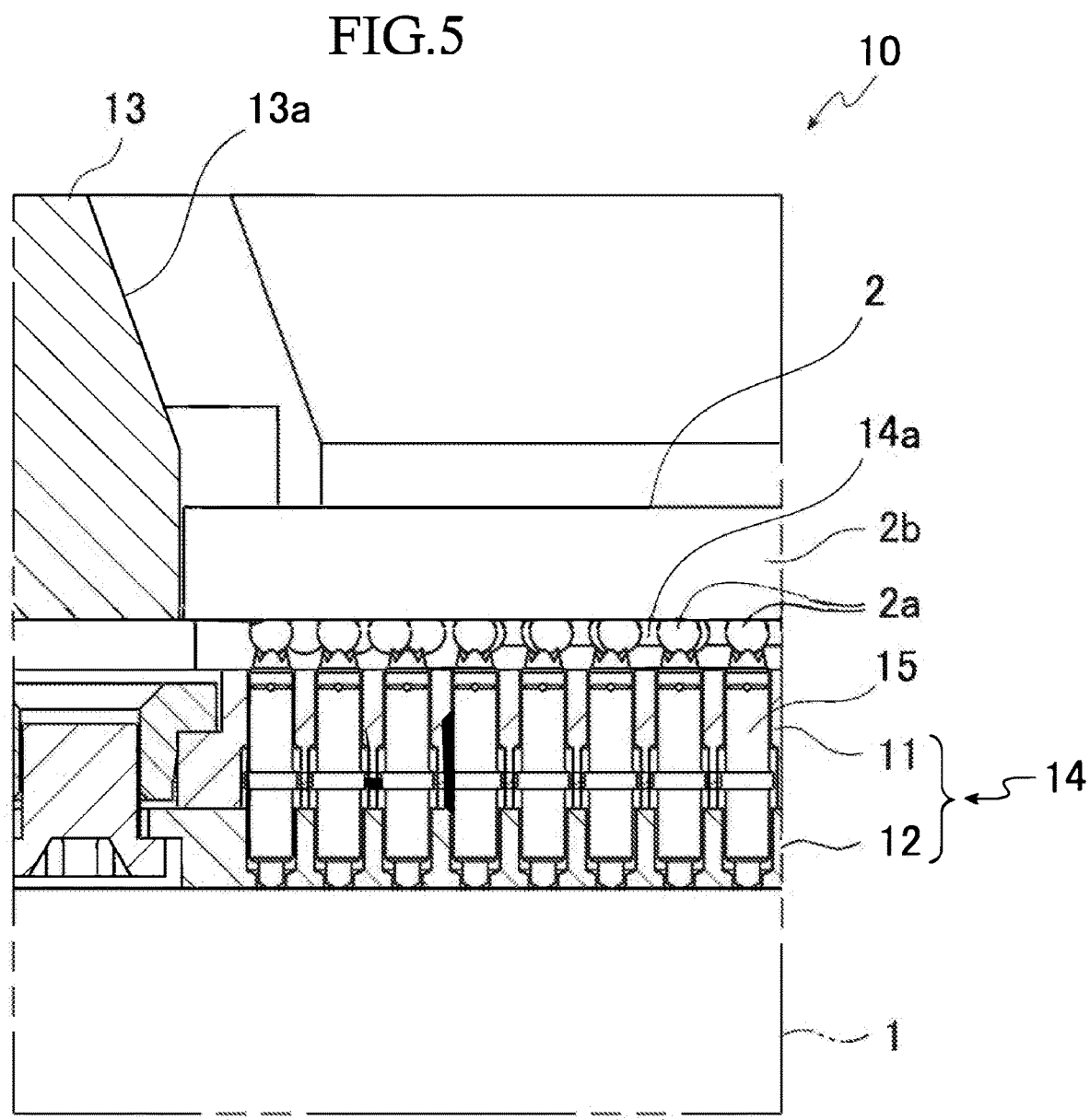
FIG. 5 is an enlarged cross-sectional view showing that the IC package is pushed downward from a state of FIG. 4.

Afterward, as shown in FIG. 4, the IC package 2 is stored in the storage portion 14a, and the solder balls 2a are brought into contact with the second contacting portions 31. In this state, when lowering a pressing jig (not shown) or the like to push the IC package 2 downwards, the eight protruding portions 35 of the second contacting portion 31 of the second plunger 30 are pressed by the solder balls 2a. As shown in FIG. 5 and FIG. 7(c), the second plunger 30 is pushed downwards. Then, each coil spring 50 is compressed by the first plunger 20 and the second plunger 30, and urges the first contacting portion 21 of the first plunger 20 and the second contacting portion 31 of the second plunger 30 in a direction away from each other. As a result, those plungers come in contact with the electrode of the wiring substrate 1, and the solder ball 2a of the IC package 2, respectively under the appropriate contact pressure to achieve the electrical connection. In the above-described state, the continuity test, such as the burn-in test, of the IC package 2 is performed.

In this way, the plurality of protruding portions 35 formed on the plurality of convex portions 38 of the second contacting portion 31 thrustingly abut on the solder ball 2a, thereby achieving the electrical connection between the IC package 2 and the contact pin 15. Consequently, the second contacting portion 31 does not deeply thrust the solder ball 2a, preventing the defect of the large flaw formed on the solder ball 2a. As the thrust applied by the protruding portion 35 is not made deep, the contact pin 15 is hardly breakable. This makes it possible to improve durability of the contact pin 15.

Furthermore, the contact pin 15 according to this embodiment includes the eight protruding portions 35 which abut on the solder ball 2a. Compared with the generally employed contact pin including four protruding portions, the embodiment allows more stable contact with the solder ball 2a.

Embodiment 2 of Invention

Figure 13:
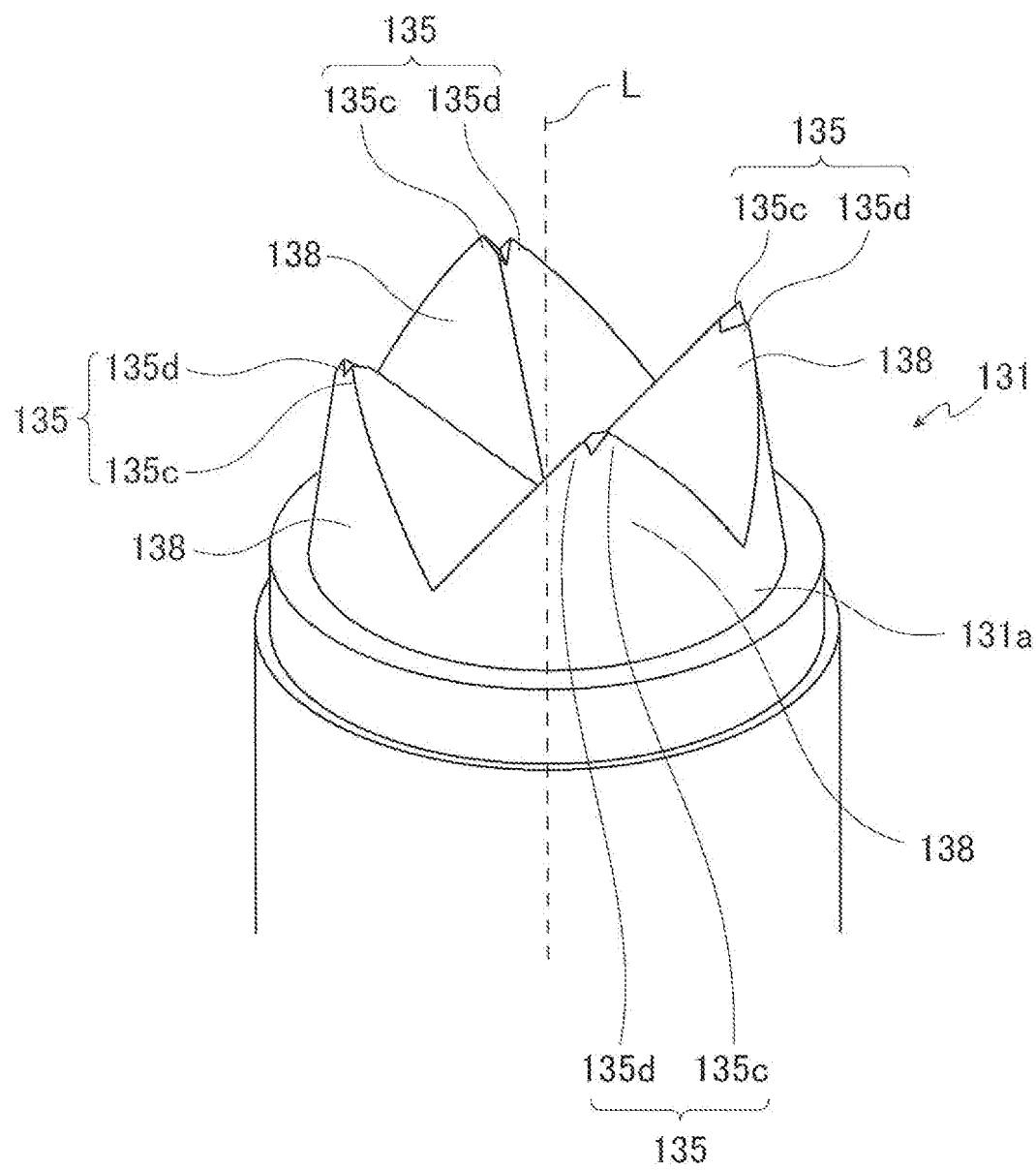
FIG. 13 is an enlarged perspective view of a contacting portion of a contact pin according to Embodiment 2 of the present invention.

FIG. 13 shows Embodiment 2 of the present invention. Note that the embodiment of the present invention is similar to Embodiment 1 described above except matters to be described below. Therefore, matters other than those different from the above-described Embodiment 1 are denoted with the same reference signs, and descriptions thereof are omitted.

In the present embodiment, the second contacting portion 31 of the second plunger 30 of the contact pin 15 in the above-described Embodiment 1 has been modified to a second contacting portion 131 having a different tip shape as shown in FIG. 13. Hereinafter, the second contacting portion 131 according to the present embodiment will be described.

As shown in FIG. 13, the second contacting portion 131 of the present embodiment has a plurality of (eight herein) protruding portions 135 likewise the above-described Embodiment 1 except that the protruding portions are different in shape.

In this embodiment, as show in FIG. 13, each height of mountain-shaped portions of the two protruding portions 135 formed on the tip of the mountain-shaped portion of the single convex portion 138 is different from each other. The height of the mountain-shaped portion of a protruding portion 135c is made higher than that of the other protruding portion 135d.

Next, description will be made as to an operation of the IC socket 10 including the contact pin 15 having the second plunger 30 provided with the above-described second contacting portion 131. Note that description similar to the above-described Embodiment 1 is omitted.

The contact pin 15 of the present embodiment has two protruding portions 135c, 135d formed on a tip portion 131a of the single convex portion 138, each having a different height. Therefore at the beginning, the higher protruding portion 135c comes in contact with the solder ball 2a. At a timing when the higher protruding portion 135c is getting worn away, the lower protruding portion 135d comes in contact with the solder ball 2a to allow persistent electrical connection. This makes it possible to secure long-term contact stability.

In the above-described Embodiments 1 and 2, the second contacting portions 31, 131 include eight protruding portions 35, 135, respectively. However, the present invention is not limited to the above-described configuration. The number of the protruding portions may be seven or less, or nine or more instead of eight so long as stable support of the solder ball is secured.

In the above-described Embodiments 1 and 2, the second contacting portions 31, 131 include four convex portions 38, 138, respectively at equal intervals. However, the present invention is not limited to the above-described configuration. The convex portions do not have to be arranged at equal intervals and, furthermore, the number of the convex portions may be three, or five or more instead of four, so long as stable support of the solder ball is secured.

It is possible to form three or more protruding portions instead of two on the single convex portion.

Furthermore, it is possible to form the protruding portion, the convex portion, the valley-shaped portion and the like into any other shapes without being limited to those described in Embodiments 1 and 2.

In the above-described Embodiments 1 and 2, the first valley-shaped portion 36 and the second valley-shaped portion 37 have the first valley bottom portion 36a and the second valley bottom portion 37a, respectively, each formed to have the substantially V-shaped cross-section. However, the present invention is not limited to the above-described configuration. It is possible to form at least one of the first valley bottom portion and the second valley bottom portion into a flat belt-like shape.

In the state where the valley bottom portion of the valley-shaped portion is formed into the flat belt-like shape, the waste that is peeled off from the solder ball in the contact state and fell into the valley bottom portion of the valley-shaped portion may be easily removed. It is therefore possible to prevent the defect owing to difficulty in removal of the waste that clogs the valley bottom portion.

It is possible to provide an outer wall portion with a predetermined height at the outer circumferential side of the first valley-shaped portion between the convex portions, and at the outer circumferential side of the second valley-shaped portion between the protruding portions for closing purposes. The above-described outer wall portion may be formed integrally with the second contacting portion. Alternatively, the outer wall portion may be formed separately from the second contacting portion, and locked from its outer circumferential side. The height of the outer wall portion may be arbitrarily set so long as the protruding portion is allowed to protrude and exhibit its function.

As described above, the outer wall portion provided for the valley-shaped portion may prevent the defect as a cause of the adverse influence owing to the waste which is peeled off from the solder ball in the contact state, and fell from the contact pin through the valley bottom portion to leak outside and disperse to the IC socket, the wiring substrate and the like.

Note that "the electrical contact" of the present invention is not limited to the contact pin having such a structure in the above-described Embodiments 1 and 2, and the present invention is also applicable to any other structure. Furthermore, in the above-described Embodiments 1 and 2, "the electric component socket" of the present invention is applied to the type of IC socket that does not have any cover and has the open upper surface. However, the present invention is not limited to this example, and is also applicable to an IC socket having the cover or the like, or a device other than the IC socket.

REFERENCE SIGNS LIST 1 wiring substrate
2 IC package (electric component)
2a solder ball (terminal) IC socket (electric component socket)
14 socket main body
15 contact pin (electrical contact)
20 first plunger
21 first contacting portion
30 second plunger
31, 131 second contacting portion (contacting portion)
31a, 131a tip portion
31b center
35, 135, 135c, 135d protruding portion
36 first valley-shaped portion
37 second valley-shaped portion
38, 138 convex portion
40 tubular member
50 coil spring

The invention claimed is:
1. An electrical contact comprising:
a contacting portion that comes in contact with a terminal of an electric component, wherein the contacting portion includes a plurality of convex portions provided around a center of a tip portion of the contacting portion, the convex portion includes a plurality of protruding portions, each protruding portion being formed on a tip of a mountain-shaped portion of the convex portion, and the protruding portions come in contact with the terminal to be electrically connected to the electric component.

2. The electrical contact according to claim 1, wherein a first valley-shaped portion is provided between each convex portion of the plurality of convex portions, the plurality of protruding portions of each convex portion includes two protruding portions that are formed on a tip of the mountain-shaped portion of the convex portion, and a second valley-shaped portion at a depth position shallower than the first valley-shaped portion is provided between the two protruding portions of each convex portion.

3. The electrical contact according to claim 2, wherein, for each convex portion of the plurality of convex portions, the two protruding portions formed on the tip of the mountain-shaped portion of the convex portion have different heights from each other.

4. An electric component socket comprising:
a socket main body disposable on a wiring substrate and having a storage portion in which an electric component is storable, and the electrical contact according to claim 1, which is disposed in the socket main body to, with the socket main body disposed on the wiring substrate and the electric component stored in the storage portion, come in contact with a terminal provided on the electric component.

5. An electric component socket comprising:
a socket main body disposable on a wiring substrate and having a storage portion in which an electric component is storable, and the electrical contact according to claim 2, which is disposed in the socket main body to, with the socket body disposed on the wiring substrate and the electric component stored in the storage portion, come in contact with a terminal provided on the electric component.

6. An electric component socket comprising:
a socket main body disposable on a wiring substrate and having a storage portion in which an electric component is storable, and the electrical contact according to claim 3, which is disposed in the socket main body to, with the socket body disposed on the wiring substrate and the electric component stored in the storage portion, come in contact with a terminal provided on the electric component.

7. An electrical contact comprising:
a contacting portion including a plurality of convex portions provided around a center of a tip portion of the contacting portion, wherein each convex portion of the plurality of convex portions includes a plurality of protruding portions, each protruding portion of the plurality of protruding portions of each convex portion of the plurality of convex portions is formed on a tip of a mountain-shaped portion of the convex portion, and the electrical contact is configured to cause the plurality of protruding portions of each convex portion of the plurality of convex portions to come in contact with a terminal of an electric component.

8. The electrical contact according to claim 7, wherein a first valley-shaped portion is provided between each convex portion of the plurality of convex portions, the plurality of protruding portions of each convex portion includes two protruding portions that are formed on a tip of the mountain-shaped portion of the convex portion, and a second valley-shaped portion at a depth position shallower than the first valley-shaped portion is provided between the two protruding portions of each convex portion.

9. The electrical contact according to claim 8, wherein, for each convex portion of the plurality of convex portions, the two protruding portions formed on the tip of the mountain-shaped portion of the convex portion have different heights from each other.

10. An electric component socket comprising:
a socket main body disposable on a wiring substrate and having a storage portion in which an electric component is storable, and the electrical contact according to claim 7, which is disposed in the socket main body to, with the socket main body disposed on the wiring substrate and the electric component stored in the storage portion, come in contact with a terminal provided on the electric component.

11. An electric component socket comprising:
a socket main body disposable on a wiring substrate and having a storage portion in which an electric component is storable, and the electrical contact according to claim 8, which is disposed in the socket main body to, with the socket body disposed on the wiring substrate and the electric component stored in the storage portion, come in contact with a terminal provided on the electric component.

12. An electric component socket comprising:
a socket main body disposable on a wiring substrate and having a storage portion in which an electric component is storable, and the electrical contact according to claim 9, which is disposed in the socket main body to, with the socket body disposed on the wiring substrate and the electric component stored in the storage portion, come in contact with a terminal provided on the electric component.

13. A socket comprising:
a socket main body disposable on a wiring substrate and having a storage portion in which an electric component is storable; and an electrical contact including:
a contacting portion including a plurality of convex portions provided around a center of a tip portion of the contacting portion, wherein each convex portion of the plurality of convex portions includes a plurality of protruding portions, each protruding portion of the plurality of protruding portions of each convex portion of the plurality of convex portions is formed on a tip of a mountain-shaped portion of the convex portion, and the electrical contact is configured to, with the socket body disposed on the wiring substrate and the electric component stored in the storage portion, cause the plurality of protruding portions of each convex portion of the plurality of convex portions to come in contact with a terminal provided on the electric component.

14. The socket according to claim 13, wherein
a first valley-shaped portion is provided between each convex portion of the plurality of convex portions,
the plurality of protruding portions of each convex portion includes two protruding portions that are formed on a tip of the mountain-shaped portion of the convex portion, and
a second valley-shaped portion at a depth position shallower than the first valley-shaped portion is provided between the two protruding portions of each convex portion.

15. The socket according to claim 14, wherein, for each convex portion of the plurality of convex portions, the two protruding portions formed on the tip of the mountain-shaped portion of the convex portion have different heights from each other.

* * * * *